United States Patent
Liu et al.

(10) Patent No.: US 10,212,824 B2
(45) Date of Patent: Feb. 19, 2019

(54) GOLD-PLATING ETCHING PROCESS FOR 5G COMMUNICATION HIGH-FREQUENCY SIGNAL BOARDS

(71) Applicant: Kunshan TVS Electronic Technology Co., Ltd, Kunshan (CN)

(72) Inventors: Jiting Liu, Kunshan (CN); Qingfeng Liu, Kunshan (CN)

(73) Assignee: Kunshan TVS Electronic Technology Co., Ltd, Kunshan (CN)

( * ) Notice: Subject to any disclaimer, the term of this patent is extended or adjusted under 35 U.S.C. 154(b) by 0 days.

(21) Appl. No.: 15/896,078

(22) Filed: Feb. 14, 2018

(65) Prior Publication Data

US 2018/0177057 A1    Jun. 21, 2018

(30) Foreign Application Priority Data

Jan. 8, 2018    (CN) .......................... 2018 1 0014782

(51) Int. Cl.
| | |
|---|---|
| *H05K 3/18* | (2006.01) |
| *H05K 3/22* | (2006.01) |
| *H05K 3/24* | (2006.01) |
| *C25D 5/12* | (2006.01) |
| *C25D 5/34* | (2006.01) |
| *C25D 5/40* | (2006.01) |
| *C25D 7/00* | (2006.01) |
| *C25D 3/48* | (2006.01) |
| *C25D 3/12* | (2006.01) |
| *H05K 3/34* | (2006.01) |
| *H05K 1/11* | (2006.01) |

(52) U.S. Cl.
CPC .............. *H05K 3/188* (2013.01); *C25D 5/12* (2013.01); *C25D 5/34* (2013.01); *C25D 5/40* (2013.01); *C25D 7/00* (2013.01); *H05K 3/181* (2013.01); *H05K 3/227* (2013.01); *H05K 3/244* (2013.01); *C25D 3/12* (2013.01); *C25D 3/48* (2013.01); *H05K 1/117* (2013.01); *H05K 3/3452* (2013.01); *H05K 2201/0338* (2013.01)

(58) Field of Classification Search
CPC ........ H05K 3/188; H05K 3/244; H05K 3/181; H05K 3/227; H05K 2201/0338; H05K 1/117; H05K 3/3452; C25D 7/00; C25D 5/40; C25D 5/34; C25D 5/12; C25D 3/12; C25D 3/48
See application file for complete search history.

(56) References Cited

U.S. PATENT DOCUMENTS

| | | | | |
|---|---|---|---|---|
| 2001/0042637 | A1* | 11/2001 | Hirose | ................ H05K 3/0035 174/255 |
| 2008/0302560 | A1* | 12/2008 | Tanno | ................ H01L 21/4853 174/255 |
| 2016/0157356 | A1* | 6/2016 | Kohiki | ................ B32B 15/08 428/156 |

* cited by examiner

Primary Examiner — Duy Vu N Deo
(74) Attorney, Agent, or Firm — Gokalp Bayramoglu

(57) ABSTRACT

A gold-plating etching process for 5G high-frequency signal boards is carried out according to the following steps: the outer dry film, the plug gold-plating, the film removing, and the alkaline etching. The alkaline etching solution comprises 100 to 150 g/L of cupric chloride, 90 to 120 g/L of ammonium chloride, and ammonia. The pH value is 9.6 to 9.8. The ratio of the ammonia and the alkaline etching solution is (550-800):1000. The present invention provides a gold-plating etching process of 5G high-frequency signal boards. The alkaline etching procedure is performed right after gold-plating, eliminating the outer etching process after gold-plating. Costs of the outer film pressing, the exposure, and the development can be saved. The flow rate is improved. Requirements of 5G communication circuit boards are satisfied. That is, the transmission speed of 5G communication high-frequency signal boards of the present invention is fast.

10 Claims, No Drawings

GOLD-PLATING ETCHING PROCESS FOR 5G COMMUNICATION HIGH-FREQUENCY SIGNAL BOARDS

CROSS REFERENCE TO RELATED APPLICATIONS

This application based upon and claims priority to Chinese Patent Application No. 201810014782.2, filed on Jan. 8, 2018, the entire contents of which are incorporated herein by reference.

TECHNICAL FIELD

The present invention relates to a fabrication process for high-frequency signal board, particularly to a fabrication process for 5G high-frequency communication signal boards.

BACKGROUND

The fifth generation mobile communication standard of mobile phone, also known as the fifth generation mobile communication technology, abbreviated to 5G. It is also an extension of 4G under study. The network speed thereof is up to 5M/S-6M/S. 5G mainly covers mobile communications, Wi-Fi, high-speed wireless data transmission and other fields. In terms of user experiences, 5G has a higher rate and a wider bandwidth. The network speed of 5G is expected to be improved to about 10 times as that of 4G. A high-definition movie can be downloaded in only a few seconds. Consumer demands of virtual reality, ultra HD video and other higher requirements of network experience can be satisfied. In terms of industrial applications, 5G has higher reliability and lower time delay and can meet the specific needs of industrial applications such as intelligent manufacturing and automatic driving, broadening the space for the development of integrated industries, and supporting the innovation and development of the economic society. Therefore, compared to 4G, 5G requires a faster transmission rate, a lower transmission time-delay, and a higher reliability. Thus, the requirements of the 5G communication circuit board are higher transmission speed, lower transmission time delay, and better reliability.

The signal transmission speed relates to the materials. The scientific practice has proved that among the commonly used, conductor materials for circuit boards, the materials with the best current transmission performance are sequentially listed as gold, aluminum, and copper. Therefore, in order to satisfy the transmission requirements, the gold-plating etching process for the entire circuit board is the preferred requirement to meet the 5G technology.

In the requirements of the traditional gold-plating process, the gold-plating process generally uses the wire to plate. Terminal customers do not allow the use of gold-plated wire in the production of circuit boards during the gold-plated process, thus, causing many technical problems in the production.

In the traditional gold-plating etching process, the gold-plated area is higher than the non-gold-plated area, meaning that they are not in the same plane. While the traditional outer dry film etching process is used, the dry film cannot completely fill the connection between the gold-plated area and the non-gold-plated area due to the altitude difference. The etching solution infiltrates into the junction of gold and copper along the gap between gold and copper during the etching, which results in the etching gap and open circuit. Thus, it is a technical problem of gold-plating technology. In addition, in the traditional process, the etching of circuit, after gold-plating, is performed with acidic etching. The costs of outer film pressing, exposure, development, etching should also be taken into consideration, affecting the transmission rate and reliability of 5G signal board.

SUMMARY OF THE INVENTION

The invention provides a gold-plating etching process for 5G high-frequency signal boards. An alkaline etching process is performed after the gold-plating, eliminating the outer etching process after gold-plating. Costs of the outer film pressing, the exposure, and the development can be saved. The flow speed is improved. The requirements of 5G communication circuit boards can be satisfied. That is, the transmission speed of 5G communication high-frequency signal boards of the present invention is fast. The transmission delay is low and the reliability is good.

In order to solve the above technical problems, a technical solution adopted by the present invention is as follows. A gold-plating etching process of 5G communication high-frequency signal boards is provided, wherein the process is performed according to the following steps:

outer dry film: performing the opening window treatment to the required circuit and gold-plated areas for gold-plating; making an entire opening window on the outer layer of the gold-plated areas;

plug gold-plating: before the plug gold-plating, cleaning, drying, and acid-pickling the copper surface to ensure that the copper surface does not get oxidized; during the gold-plating process, performing the nickel-plating at first, and then performing the activation treatment, and then performing gold-plating; wherein the gold surface required to be lustrous and not rough after the gold-plating;

film removing: using the sodium hydroxide to remove the film;

alkaline etching: using alkaline etching solution as etchant in alkaline etching; wherein during alkaline etching process, the circuit and the gold-plating areas are under the protection of gold after gold-plating; the dry films on the non-gold-plated areas are stripped off by the film removing process before the alkaline etching; and the copper surface is exposed to be etched by the alkaline etching solution;

the alkaline etching solution comprises 50-250 g/L of cupric chloride, 70-150 g/L of ammonium chloride, and ammonia; the pH value is 9-10; and the temperature of the etching is 50-60° C.;

the ratio of the ammonia to the alkaline etching solution is (550-800):1000.

Further, the fabrication process for the high-frequency signal boards includes the following steps: cutting, board baking, inner circuit, electroplating, outer dry film, plug gold-plating, film removing, alkaline etching, optical inspection, solder mask, texting, paneling, electrical testing and visual inspection.

Further, in the plug gold-plating step, the nickel-plating solution used in the nickel-plating process includes 250-300 g/L of nickel sulfate hexahydrate 35-45 g/L of nickel chloride hexahydrate, 35-45 g/L of boric acid, and brightener; the ratio of the brightener to the nickel-plating solution is (30-35):1000.

Further, an optical testing machine is used to scan the surface of the board to detect circuit gaps and pinholes after the step of outer dry film and before the step of plug gold-plating.

Further, during the activation treatment, the temperature of the activation solution is 50-55° C., and the soaking time is 0.5-2 min.

Further, cleaning and drying are performed directly after performing the alkaline etching.

Further, the gold-plating solution used in the plug gold-plating process includes 2-2.5 g/L of potassium aurocyanide and 0.6-0.8 g/L of plating bath solution. The gold-plating temperature is 50-55° C. The pH value is 3.2-3.5.

Further, the concentration of the sodium hydroxide solution in the film removing step is 1.0%, and the temperature of the film removing is 38 to 42° C.

Further, the alkaline etching solution comprises 100-150 g/L of cupric chloride, 90-120 g/L, of ammonium chloride, and ammonia. The pH value is 9.6-9.8.

Further, the ratio of the ammonia to the alkaline etching solution is (670-700):1000.

Further, the temperature of etching is 52-58° C.

The advantages of the present invention are as below.

In the fabrication process of the 5G high-frequency signal boards, the alkaline etching is used instead of the traditional outer etching. The gold-plating is directly followed by the alkaline etching process. The ability of etching of the alkaline etchant is weak, so that the gold surface can protect the circuit, eliminating the outer etching process after gold-plating. Costs of outer layer film pressing, exposure, and development can be saved. The flow speed is improved. In the present invention, the etching gaps and open circuit caused by the infiltration of the acidic etchant into the junction of the gold and copper on the 5G communication high-frequency signal board can be addressed. The requirements of the circuit board for 5G communication are satisfied. That is, the 5G communication high-frequency signal board of the present invention has the advantages of faster transmission rate, lower transmission time-delay and, better reliability.

The above description of the present invention is merely an overview of the technical solutions of the present invention. In order to clearly understand the technical solutions of the present invention and implement according to the contents of the specification, the preferred embodiments of the present invention are described in detail below.

DETAILED DESCRIPTION OF THE INVENTION

Specific embodiments of the present invention will be described below by specific embodiments. Those skilled in the art can easily understand the advantages and efficacy of the present invention from the contents disclosed in this specification. The present invention may be embodied in other various forms, that is, various modifications and changes may be made without departing from the scope of the present invention.

Embodiment: a gold-plating etching process for 5G communication high-frequency signal boards, which is carried out according to the following steps:

Outer dry film: the opening window treatment is performed on the desired circuit and gold-plated areas for gold-plating. This process is equivalent to the outer positive etching process, making an entire opening window on the outer layer of the gold-plated areas. After outer dry film, an optical inspection machine is used to scan the surface of board to detect circuit gaps and pinholes;

Plug gold-plating: before plug gold-plating, the copper surface should be cleaned, dried and, acid-pickling to ensure that the copper surface does not get oxidized. During gold-plating process, the nickel-plating is performed at first. In order to ensure the good adhesive strength between the nickel layer and the copper layer of the high-frequency signal board, a fresh solution is prepared with pure chemical reagents. In practical production, 10% sulfuric acid or 10% sodium hydroxide is used to adjust the pH value. A small current of 1.0 A is used for electrolysis. The formula of the nickel-plating solution includes 250-300 g/L of nickel sulfate hexahydrate 35-45 g/L of nickel chloride hexahydrate, 35-45 g/L of boric acid, and brightener. The ratio of the brightener to the nickel-plating solution is (30-35):1000. Since nickel is prone to passivation in the air, an activation treatment is performed within 1-3 min after nickel-plating. The activation solution is CP40, 120 g/L. The solution temperature is controlled at 50-55° C. The soaking time is about 0.5-2 min. The gold-plating solution includes 2-2.5 g/L of potassium aurocyanide and 0.6-0.8 g/L, of plating bath solution. The temperature thereof is 50-55° C. The pH value is 3.2-3.5. A small current of 1.0 A/m$^2$ is selected. The gold surface is required to be lustrous and not rough after gold-plating.

Film removing: sodium hydroxide is used to remove the film. The concentration of sodium hydroxide solution is 1.0%. The film removing is performed at the temperature of 38-42° C. The edge of the circuit is checked to make sure whether the film is removed completely after the film removing, so as to avoid residual copper on the circuit side or burrs during the alkaline etching process.

Alkaline etching: the etchant used in the alkaline etching process is the alkaline etching solution. In the alkaline etching process, the circuit and the gold-plated areas are protected by the gold after the gold-plated areas are gold-plated. The dry films in the non-gold-plated areas are stripped off by the film removing process before the alkaline etching, such that the copper surface is exposed to be etched by the alkaline etching solution.

The alkaline etching solution comprises 100-150 g/L of $CuCl_2$ (cupric chloride), 90-120 g/L of $NH_4Cl$ (ammonium chloride), and $NH_3.H_2O$ (ammonia), wherein the ratio of the ammonia to the alkaline etching solution is (670-700):1000, and the pH value of the alkaline etching solution is 9.6-9.8. The main chemical reaction equation of alkaline etching is $CuCl_2+NH_3 \rightarrow Cu((NH_3))_4Cl_2$. The copper on the surface of the high-frequency signal board is oxidized by complex ion $\{Cu(NH_3)_4\}^{2+}$. The etching reaction equation is $Cu+Cu(NH_3)_4Cl_2 \rightarrow 2\ Cu(NH_3)_2Cl$. The produced $\{Cu(NH_3)_2\}^{1+}$ does not have the etching ability, but can be rapidly oxidized by the oxygen in the air in the presence of excess ammonia and chloride ions, so as to produce complex ions $\{Cu(NH_3)_4\}^{2+}$ having the etching ability. The regeneration reaction equation is $2Cu(NH_3)_2Cl+2NH_4Cl+2NH_3+\frac{1}{2}O_2 \rightarrow 2Cu(NH_3)_4Cl+H_2O$. $CuCl_2$, $NH_4Cl$ and $NH_3.H_2O$ are added according to the proportion of etching during the reaction. The etching is performed at the temperature of 52-58° C. The etching time and line speed are set according to the thickness of the copper. Generally, the tin stripping section may be performed after etching. The main ingredient of tin stripping solution is nitric acid, which is strong acid. Although the gold surface has anti-corrosion property, the gold will be thinned during the reaction. In addition, the appearance of the gold will become rough, affecting the gold thickness and appearance of the finished product. Thus, the tin stripping will not be performed after alkaline etching. Rather, cleaning and drying processes are performed to clean the surface of the high-frequency signal board.

The fabrication process of the high-frequency signal board sequentially includes the following steps: cutting, board baking, inner circuit, electroplating, outer dry film, plug gold-plating, film removing, alkaline etching, optical inspection, solder mask, texting, paneling, electric testing and visual inspection.

In the process of cutting, the substrate after being cutting is baked at 200° C. for 3 hours, the material of the substrate is chosen FR-4, and the thickness of the substrate is 0.6 mm.

In the process of board baking, the temperature of the board baking is Tg+5° C.-Tg+15° C., the baking time is 1.5 hours to 3 hours. Tg is the critical temperature at which the raw material melts from a solid state to liquid in rubbery state. Strict control of the board baking temperature and time can effectively prevent the separation of the coating and the substrate, to further solidify the substrate resin and enhance the binding force between the coating and the substrate.

In the process of the inner circuit, electroless copper plating is conducted on the substrate at first, and then, a layer of wet film is pressed on the substrate conducted electroless copper plating. A negative film is covered on the wet film, then conducting exposure and development, so that the copper layer at the position of the non-circuit pattern is exposed and etched. After that, the wet film is removed to form the inner circuit. The minimum line width of the inner circuit is 0.15 mm and the minimum line-space is 0.13 mm.

In the process of the inner circuit, the light level of exposure is level 10 to level 11, the speed of the development is 4.5-5.1 m/min, and the time of the development is 60 s.

In the optical inspection, the gold surface is brighter than the copper surface since the reflectivity of the gold surface is different from that of the copper surface. The grayscale of the optical inspection machine needs to be adjusted. The grayscale range of the general copper panel is 130-170. In order to scan the entire gold-plated board, the grayscale should be adjusted to 70-120.

In the process of solder mask, a solder mask is brushed on the signal board, next, baking the signal board brushed with older mask at 70° C.-90° C. for 80 min-120 min at first, and then, baking at 80° C.-90° C., for 45 min-70 min, and filially, baking at 100° C.-150° C., for 45 min-70 min. Compared with the prior art, the older mask in the present invention is baked and cured in three different temperature stages, including a low temperature stage of 70° C. to 90° C., a medium temperature stage of 80° C. to 120° C. and a high temperature stage of 100° C. to 150° C., and extending the baking time of low temperature stage, to improve the solder mask effect and promote product quality.

In the process of solder mask, since the products of customers are high-frequency signals, the requirement for signal transmission is high. Noise and crosstalk cannot be generated in transmission and reception of signals. Thus, the surface of the circuit cannot be brushed and polished. Sand blasting and acid pickling processes are used as pre-treatment of the outer layer to clean the board surface.

In the process of electric testing and visual inspection, the test is performed in accordance with the IPC three-level standard.

The foregoing descriptions are merely embodiments of the present invention and are not intended to limit the scope of the present invention. All equivalent constructions made by using the contents of the present invention, or directly of indirectly applied to other related technical fields are also included in the protection scope of the present invention.

What is claimed is:

1. A gold-plating etching process for 5G communication high-frequency signal boards, wherein the process comprises the following steps:
    outer dry film: performing an opening window treatment on a circuit and gold-plated areas for a gold-plating; making an entire opening window on an outer layer of the gold-plated areas;
    plug gold-plating: before the plug gold-plating, cleaning, drying, and acid-pickling a copper surface to ensure that the copper surface will not be oxidized; during the gold-plating process, performing a nickel-plating at first, and then performing an activation treatment, and then performing a gold-plating;
    film removing: removing a film with sodium hydroxide;
    alkaline etching: using an alkaline etching solution as an etchant during the alkaline etching; wherein during an alkaline etching process, the circuit and the gold-plating areas are under the protection of gold after gold-plating; stripping off dry films in an non-gold-plated areas by the film removing process before the alkaline etching, such that the copper surface is exposed to be etched by the alkaline etching solution; wherein the alkaline etching solution comprises 50-250 g/L of cupric chloride, 70-150 g/L of ammonium chloride, and ammonia; a pH value of alkaline etching solution is 9-10; a temperature of the etching is 50-60° C.;
    a ratio of the ammonia to the alkaline etching solution is (550-800):1000;
    wherein tin stripping is not performed after the alkaline etching.

2. The gold-plating etching process for 5G communication high-frequency signal boards according to claim 1, wherein
    a fabrication process for the high-frequency signal boards sequentially comprises cutting, board baking, inner circuit, electroplating, outer dry film, plug gold-plating, film removing, alkaline etching, optical inspection, solder mask, texting, paneling, electric testing and visual inspection.

3. The gold-plating etching process for 5G communication high-frequency signal boards according to claim 1, wherein
    in the step of plug gold-plating, the nickel-plating solution used in the process of nickel-plating comprises 250 to 300 of nickel sulfate hexahydrate, 35 to 45 g/L of nickel chloride hexahydrate, 35 to 45 g/L of boric acid, and brightener; and
    a ratio of the brightener to the nickel-plating solution is (30-35):1000.

4. The gold-plating etching process for 5G communication high-frequency signal boards according to claim 1, further comprising
    scanning a surface of the 5G communication high-frequency signal board with an optical testing machine to detect circuit gaps and pinholes after the step of outer dry film and before the step of plug gold-plating.

5. The gold-plating etching process for 5G communication high-frequency signal boards according to claim 1, further comprising
    performing cleaning and drying directly after the alkaline etching.

6. The gold-plating etching process for 5G communication high-frequency signal boards according to claim 1, wherein
   in the step of plug gold-plating, the gold-plating solution comprises 2 to 2.5 g/L of potassium aurocyanide and 0.6 to 0.8 g/L of plating bath solution;
   a temperature of the gold-plating is 50 to 55° C.; and
   a pH value is 3.2 to 3.5.

7. The gold-plating etching process for 5G communication high-frequency signal boards according to claim 1, wherein
   in the step of the film removing, a concentration of the sodium hydrate used is 1.0%; and
   a temperature of the film removing is 38 to 42° C.

8. The gold-plating etching process for 5G communication high-frequency signal boards according to claim 1, wherein
   the alkaline etching solution comprises 100 to 150 g/L of cupric chloride, 90 to 120 g/L of ammonium chloride, and ammonia; and
   a pH value of alkaline etching solution is 9.6 to 9.8.

9. The gold-plating etching process for 5G communication high-frequency signal boards according to claim 1, wherein
   a ratio of the ammonia to the alkaline etching solution is (670 to 700):1000.

10. The gold-plating etching process for 5G communication high-frequency signal boards according to claim 1, wherein
    a temperature of the etching is 52 to 58° C.

* * * * *